United States Patent [19]

Bannister

[11] Patent Number: 4,669,030
[45] Date of Patent: May 26, 1987

[54] ENCLOSURE FOR ELECTRICAL CIRCUITRY HAVING A HOUSING WITH A REVERSIBLE BACKPLATE

[75] Inventor: Roger Bannister, Carmyle, Scotland

[73] Assignee: Schlumberger Electronics (UK) Limited, Farnborough, England

[21] Appl. No.: 676,956

[22] Filed: Nov. 30, 1984

[30] Foreign Application Priority Data

Nov. 30, 1983 [GB] United Kingdom ................ 8331984

[51] Int. Cl.$^4$ ............................................. H05K 1/14
[52] U.S. Cl. .................................... 361/395; 361/380; 361/399
[58] Field of Search ...................... 200/38 R, 38 FB; 339/31 R, 119 R, 125 R, 193 P; 361/334, 391, 395, 399, 195, 142

[56] References Cited

U.S. PATENT DOCUMENTS

| | | | |
|---|---|---|---|
| 2,885,600 | 5/1959 | Wiseman | 361/334 |
| 4,034,871 | 7/1977 | Jurgensen | 361/399 |
| 4,249,227 | 2/1981 | Kato et al. | 361/334 |
| 4,276,631 | 6/1981 | Fujita | 361/195 |
| 4,507,526 | 3/1985 | Thoma | 200/38 FB |

FOREIGN PATENT DOCUMENTS 2226438 12/1973 Fed. Rep. of Germany .
2123614 1/1984 United Kingdom .

Primary Examiner—A. D. Pellinen
Assistant Examiner—Gregory D. Thompson
Attorney, Agent, or Firm—Dale Gaudier

[57] ABSTRACT

An electrical time-switch has two relays on a circuit board with electrical connector blades extending from it. A backplate carrying cable connectors is provided with slots such that it can be fitted over the blades, making electrical connection between the cable connectors and the circuit board, with either face exposed. Thus the same backplate can be used for both wall-mounting and panel-mounting, while maintaining ease of access to the cable connectors for cable attachment. An optional unit with a second pair of relays can be fitted on the circuit board and has additional blades for connection to the extra relays.

4 Claims, 4 Drawing Figures

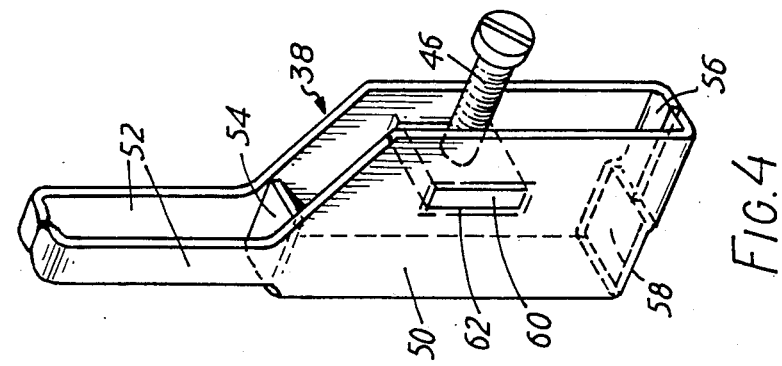
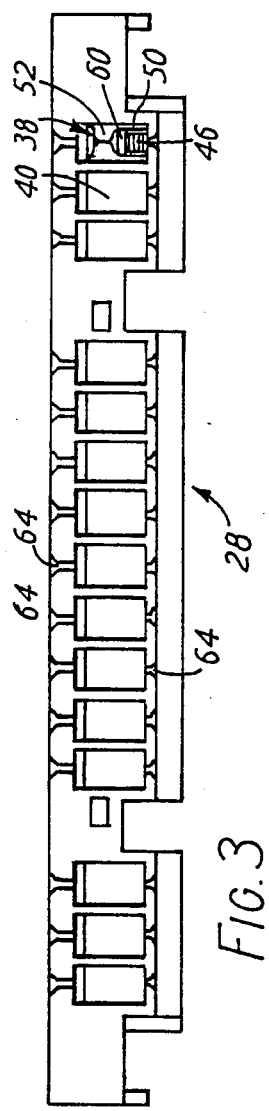
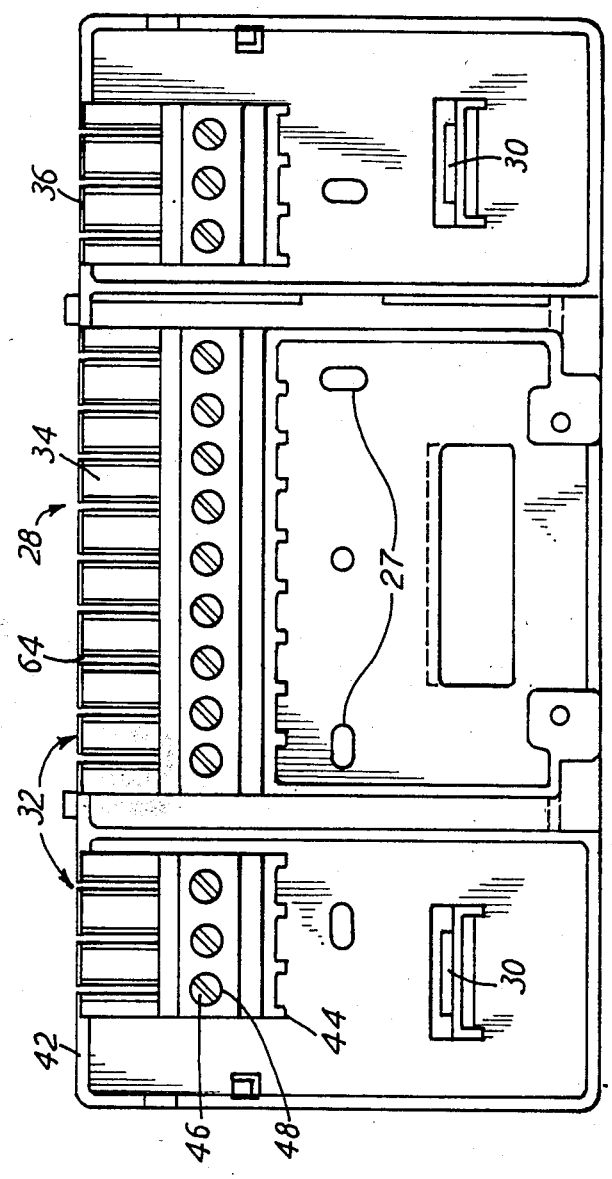

ENCLOSURE FOR ELECTRICAL CIRCUITRY HAVING A HOUSING WITH A REVERSIBLE BACKPLATE

TECHNICAL FIELD

This invention relates to an enclosure for electrical circuitry which is suitable for both surface-mounting and panel-mounting, for example electrical time-switches.

BACKGROUND ART

Electrical time-switches are commonly mounted in two ways: surface-mounting, in which the back of the time-switch is secured to the mounting surface, so that the switch protrudes therefrom; and panel-mounting in which the housing of the time-switch is secured to a panel so that only the front face of the switch is visible from the front of the panel.

In known time-switches, the backplate of the switch housing and the electrical terminals for receiving leads to be coupled to the switch are arranged primarily for one or other mounting method, thereby making it more difficult to mount the switch by the alternative method. Thus, the terminals may be on the external face of the backplate, for example, facilitating connection in the case of panel-mounting but making surface-mounting more complicated.

DISCLOSURE OF THE INVENTION

According to one aspect of this invention, there is provided electrical apparatus having a housing and a backplate, and including circuitry to be coupled to the exterior of the apparatus via the backplate. The backplate has at least one terminal for receiving an electrical lead to be coupled to the circuitry, said terminal including a first connector portion accessible from both faces of the backplate. The circuitry includes at least one second connector portion arranged to engage said first connector portion irrespective of which face of the backplate is adjacent the housing, whereby said backplate can be used for both surface- and panel-mounting of the apparatus.

According to another aspect of the invention, there is provided an electrical time-switch comprising at least one relay, and electrical circuitry connected to said relay and arranged to control the switching thereof at selectable times. The electrical circuitry has a connector at which it is arranged to produce control signals for controlling at least one further relay. The electrical circuitry includes a removable module containing said further relay, said module having a connector arranged to mate with the connector of the electrical circuitry.

Preferably, the time-switch comprises a housing containing said at least one relay and said electrical circuitry, said module being adapted to fit and locate within the housing.

BRIEF DESCRIPTON OF DRAWINGS

Electrical apparatus in accordance with this invention in the form of an electrical time-switch will now be described, by way of example, with reference to the accompanying drawings, in which:

FIG. 2 is a view of one face of a backplate of the time-switch;

FIG. 3 is an edge view of the backplate; and

FIG. 4 is a perspective view of a connector contained in the backplate.

BEST MODE FOR CARRYING OUT THE INVENTION

Figure 1:
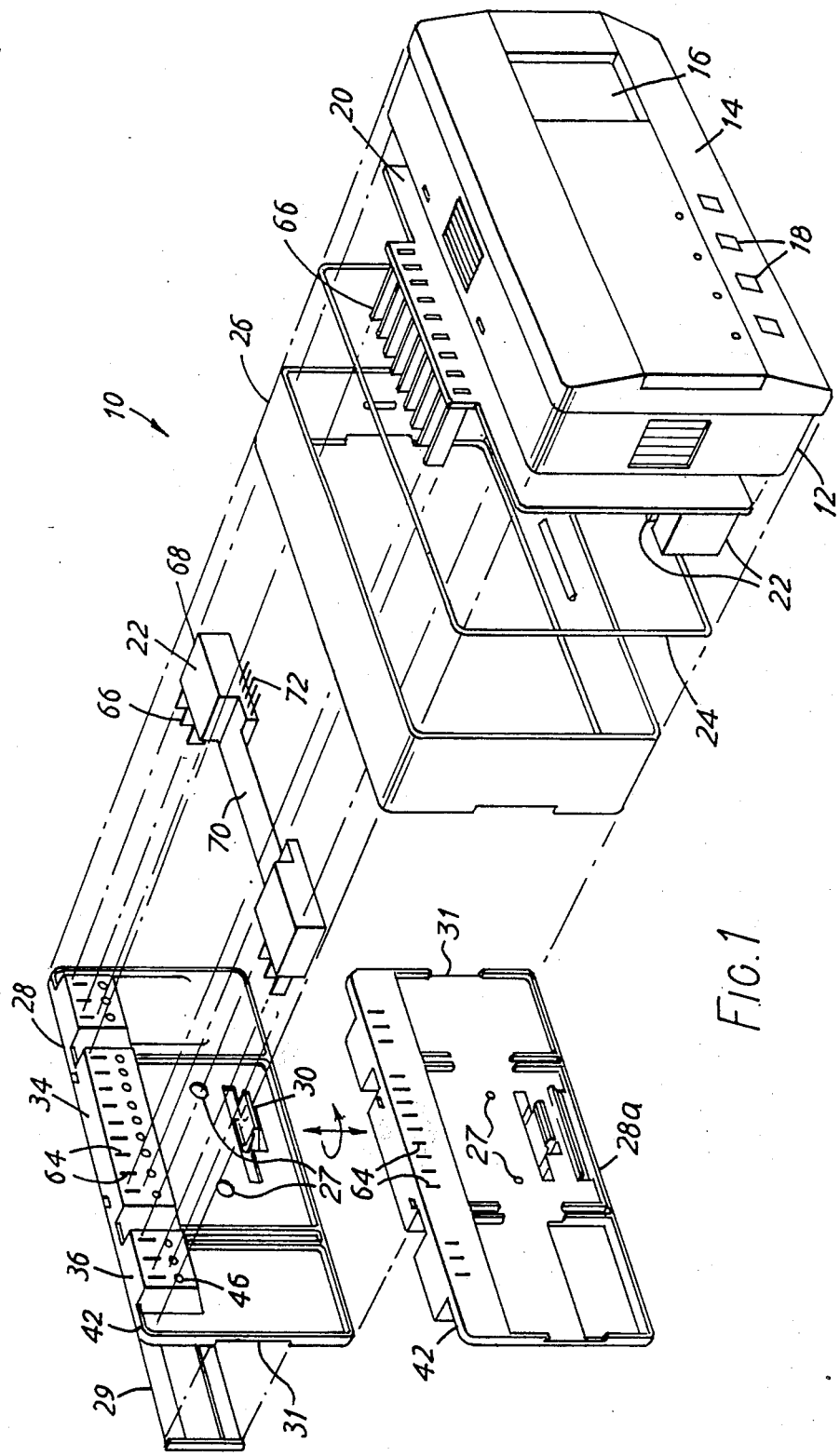
FIG. 1 is an exploded perspective view of the time-switch and its associated housing.

Referring to FIG. 1, a time-switch 10 has a housing 12 including a front panel 14 with a display 16 and controls 18; a circuit board 20 carrying electronic circuitry (not shown) and two relays 22; a sealing gasket 24; a cosmetic cover 26 which surrounds the housing 12; and a backplate 28. The display 16, the controls 18 and the electronic circuitry on the circuit board 20 are preferably as described in U.S. Ser. No. 667,291, filed Nov. 1, 1984, the disclosure of which is incorporated herein by reference.

The time-switch 10 is intended for mounting in either of two ways, using the same backplate: surface mounting or panel mounting. In the first way, the time-switch 10 is either simply screwed to a flat surface such as a wall by screws (not shown) which pass through holes 27 in the backplate 28, or mounted on such a flat surface by means of a standard DIN wall mounting rail 29 by means of side slots 31 shaped to engage the rail. In the second way, the time-switch 10, with the backplate 28 reversed, is mounted in a panel (not shown) with only the front panel 14 protruding therethrough. The backplate 28 is a polycarbonate moulding and is shown in greater detail in FIGS. 2 and 3.

Referring to FIGS. 2 and 3, the backplate 28 has latches 30 which are shaped to co-operate with the side slots 31 of FIG. 1 in engaging the DIN rail 29 in one wall-mounting mode (two such latches 30 are provided in practice, as shown in FIGS. 2 and 3, though only one appears in FIG. 1 which has been slightly simplified for the sake of clarity); in addition the backplate 28 has a connector block 32 (symmetrical about the centre-line of the backplate) divided into a main block 34 and two subsidiary blocks 36. The main block 34 has a total of nine connectors 38, while each of the subsidiary blocks 36 has three. Each connector 38 is housed in a cavity 40 extending through the block from one edge 42 of the backplate 28 to the lower face 44 of the connector block, and includes a clamping screw 46 located in a transverse hole 48 in the block.

A connector 38 is shown in detail in FIG. 4, and is made as a brass stamping, with side walls 50, upwardly-extending arms 52 and an abutment 54 extending between the arms 52 where they meet the walls 50. The tips of the arms 52 are bent in to meet one another, and the bottom of each wall 50 is also bent in to form a base 56, but with a cutaway 58 beneath the abutment 54. A captive nut 60 is held in slots 62 in the side walls 50 to receive the clamping screw 46.

Each connector 38 is dropped into its cavity 40 from the top edge of the backplate 28 (as viewed in FIG. 2), and its screw 46 inserted through the associated hole 48 and engaged in the nut 60 to retain the connector 38 in the connector block. A cable can then be inserted into the connector 38 via the bottom end of the cavity 40 and the cutaway 58, so that its end contacts the abutment 54, and the clamping screw 46 tightened onto the cable to secure it and make an electrical connection. Cavity 40, cutaway 58 and clamping screw 46 of connector 38 constitute an input or output terminal for the electrical circuit.

The arms 52 of each connector 38 extend into the upper portion of each cavity 40 defining a resilient receptacle accessible from each face of the backplate 28 via slots 64 extending through the walls of each cavity 40.

The circuit board 20 carrying the relays 22 has nine blades 66 protruding backwards therefrom, the position, size and spacing of which match those of the slots 64 in the main connector block 34. These blades are coupled to the power supply terminals of the time-switch circuitry and to the change-over contacts of the relays 22.

When the time-switch is to be wall-mounted on a DIN rail, the backplate 28 is detached from the housing 12 and fixed to the DIN rail 29 by means of the co-operating latches 30 and side-slots 31. The required electrical connections (power in and wiring to the time-controlled appliances) are made to the connector block 34, and possibly to the blocks 36, the cables being secured as described above.

Then the remaining assembly of housing 12, circuit board 20, gasket 24 and cover 26 are fixed to the backplate 28. In the process the blades 66 pass through the slots 64 and engage between the arms 52 of each respective connector 38, thereby completing the electrical connection to the circuitry and relays of the time-switch 10.

In the case of panel mounting, the backplate 28 is turned horizontally through 180°, as shown at 28a in FIG. 1, and fixed to the back of the housing 12; the connectors 38 are thus engaged (in advance) with the blades 66, but through the slots 64 in the other face of the backplate 28. The housing 12 is secured to the panel (not shown), the cover 26 being used as a clamp, and the required electrical connections made to the connector block 34, the clamping screws 46 now being exposed on the rear of the time-switch 10.

For either type of fixing the same backplate 28 can be used, thereby avoiding the need for different types of backplate for different fixings; nonetheless, by virtue of the reversibility of the backplate 28, the clamping screws 46 and connectors 38 are always readily accessible on the exposed face of the backplate 28, thereby facilitating electrical connection.

As shown in FIG. 1, the time-switch 10 includes the option of being expanded to provide four relays 22 instead of just two. To this end, a supplementary relay unit or module 68 is provided, with two additional relays 22 mounted on and joined by a flat printed circuit board 70, the module 68 being potted for strength and electrical safety. The central portion of the printed circuit board 70 (i.e. the portion between the additional relays 22) fits under the blades 66 on the circuit board 20, thereby locating the two additional relays, which each have three blades 66 protruding from them, in line with the subsidiary connector blocks 36. Also mounted on the printed circuit board 70 are the circuit components (not shown) for energising each additional relay 22 under the control of the electronic circuitry on the circuit board 20. These circuit components principally comprise a thyristor for each additional relay 22, and a connector comprising pins 72 is provided on the module 68 to connect the circuit components electrically to the electronic circuitry on the circuit board 20. The module 68 is designed to latch into the housing 12, such that on removal of the base 28 from the housing, the module remains in the housing until it is separately removed.

Many variations can be made to the time-switch 10. For example, in one variant, the connector block 32 is divided into five subsidiary blocks each containing three of the connectors 38. In this variant, the electronic circuitry is also divided, into lower power control circuitry, which is mounted on the printed circuit board 20, and a separate power supply for this lower power control circuitry. This separate power supply is mounted on a further printed circuit board together with the relays 22. The further printed circuit is mounted parallel to, but spaced from, the board 20, over the left hand three fifths thereof as viewed in FIG. 1, and has nine blades 66 which co-operate with the leftmost nine connectors 38. The further board is electrically connected to the board 20 by a jumper lead, typically in the form of a flat ribbon cable.

The relay module 68 is replaced in this variant with a rectangular relay module, which contains basically the same components as the module 68 but which fits over the right hand two fifths of the board 22. This rectangular relay module has locating means which engage co-operating locating means provided in the housing 12, to positively locate and hold the module therein with its pins 72 in engagement with a socket provided on the right hand two fifths of the board 70. The six blades 66 of the rectangular relay module co-operate with the rightmost six connectors 38.

I claim:

1. An enclosure for electrical circuitry comprising:
    a housing having a front face and a rear portion, said rear portion being substantially planar and open;
    a removable and reversible backplate removably closing the rear portion of the housing, the backplate having first and second oppositely disposed sides; and
    means for electrically connecting an electrical circuit mounted within the housing to the backplate, comprising:
    a plurality of male connectors mounted within the housing and projecting therefrom into the plane of the rear portion of the housing;
    a plurality of female electrical connectors mounted to the backplate, said female connectors being accessible from both sides of the backplate, the backplate being securable to the housing in a first position in which the first side of the backplate faces into the open rear portion of the housing and a second position in which the second side of the backplate faces into the open rear portion of the housing, said female electrical connectors of the backplate mating with respective ones of said male electrical connectors of the housing when the backplate is in each of the said positions; and
    each of said female electrical connectors being electrically connected to a respective terminal disposed on the first side of the backplate, said terminals constituting input and output terminals for the electrical circuit;
    whereby when said backplate is secured to the housing in its first position, said terminals are disposed inside the housing and the enclosure is suitable for mounting directly onto a substantially planar surface and when said backplate is secured to the housing in its second position said terminals are disposed outside the housing and the enclosure is suitable for mounting within an opening of a substantially planar surface.

2. The enclosure of claim 1, wherein:
    each female connector comprises a resilient receptacle disposed in a cavity formed in the backplate, and the backplate is provided with respective slots extending into each said cavity from each of said sides of the backplate; and each male connector comprises a blade which passes through a respective slot and makes electrical contact with the respective receptacle.

3. The enclosure of claim 2, wherein each of said terminals is integrally connected to its respective receptacle.

4. The enclosure of claim 1, wherein said male and female connectors are symmetrically disposed on each side of a line of symmetry in the plane of the rear position of the housing.

* * * * *